(12) United States Patent
Baselmans et al.

(10) Patent No.: US 7,079,225 B2
(45) Date of Patent: Jul. 18, 2006

(54) LITHOGRAPHIC APPARATUS AND DEVICE MANUFACTURING METHOD

(75) Inventors: Johannes Jacobus Matheus Baselmans, Oirschot (NL); Anastasius Jacobus Anicetus Bruinsma, Delft (NL); Pieter Willem Herman De Jager, Rotterdam (NL); Henri Johannes Petrus Vink, Delft (NL)

(73) Assignee: ASML Netherlands B.V, Veldhoven (NL)

( * ) Notice: Subject to any disclaimer, the term of this patent is extended or adjusted under 35 U.S.C. 154(b) by 31 days.

(21) Appl. No.: 10/939,947

(22) Filed: Sep. 14, 2004

(65) Prior Publication Data
US 2006/0055905 A1 Mar. 16, 2006

(51) Int. Cl.
G03B 27/54 (2006.01)
G03B 27/42 (2006.01)

(52) U.S. Cl. .......................................... 355/67; 355/53
(58) Field of Classification Search ................. 355/53, 355/55, 67–71; 250/548; 356/399–401
See application file for complete search history.

(56) References Cited

U.S. PATENT DOCUMENTS

| | | |
|---|---|---|
| 5,229,872 A | 7/1993 | Mumola |
| 5,296,891 A | 3/1994 | Vogt et al. |
| 5,500,736 A | 3/1996 | Koitabashi et al. |
| 5,523,193 A | 6/1996 | Nelson |
| 5,530,482 A | 6/1996 | Gove et al. |
| 5,579,147 A | 11/1996 | Mori et al. |
| 5,677,703 A | 10/1997 | Bhuva et al. |
| 5,808,797 A | 9/1998 | Bloom et al. |
| 5,982,553 A | 11/1999 | Bloom et al. |
| 6,133,986 A | 10/2000 | Johnson |
| 6,177,980 B1 | 1/2001 | Johnson |
| 6,515,257 B1 * | 2/2003 | Jain et al. .............. 219/121.73 |
| 6,624,880 B1 * | 9/2003 | Sandstrom et al. ........... 355/71 |
| 6,687,041 B1 | 2/2004 | Sandstrom |
| 6,747,783 B1 | 6/2004 | Sandstrom |
| 6,795,169 B1 | 9/2004 | Tanaka et al. |
| 6,806,897 B1 | 10/2004 | Kataoka et al. |
| 6,811,953 B1 | 11/2004 | Hatada et al. |
| 6,967,711 B1 * | 11/2005 | Gui ............................. 355/67 |
| 2004/0041104 A1 | 3/2004 | Liebregts et al. |
| 2004/0130561 A1 | 7/2004 | Jain |
| 2005/0007572 A1 | 1/2005 | George et al. |

FOREIGN PATENT DOCUMENTS

| | | |
|---|---|---|
| WO | WO 98/33096 | 7/1998 |
| WO | WO 98/38597 | 9/1998 |

* cited by examiner

Primary Examiner—Henry Hung Nguyen
(74) Attorney, Agent, or Firm—Sterne, Kessler, Goldstein & Fox P.L.L.C.

(57) ABSTRACT

Use of a refraction grating to divide a beam of radiation into a plurality of sub-beams that are each directed onto an array of individually controllable elements, modulated thereby and projected onto a substrate as an array of spots.

17 Claims, 5 Drawing Sheets

LITHOGRAPHIC APPARATUS AND DEVICE MANUFACTURING METHOD

BACKGROUND OF THE INVENTION

1. Field of the Invention

The present invention relates to a lithographic apparatus and a device manufacturing method.

2. Related Art

A lithographic apparatus is a machine that applies a desired pattern onto a target portion of a substrate. The lithographic apparatus can be used, for example, in the manufacture of integrated circuits (ICs), flat panel displays, and other devices involving fine structures. In a conventional lithographic apparatus, a patterning means, which is alternatively referred to as a mask or a reticle, may be used to generate a circuit pattern corresponding to an individual layer of the IC (or other device), and this pattern can be imaged onto a target portion (e.g., comprising part of one or several dies) on a substrate (e.g., a silicon wafer or glass plate) that has a layer of radiation-sensitive material (e.g., resist). Instead of a mask, the patterning means may comprise an array of individually controllable elements that generate the circuit pattern.

In general, a single substrate will contain a network of adjacent target portions that are successively exposed. Known lithographic apparatus include steppers, in which each target portion is irradiated by exposing an entire pattern onto the target portion in one go, and scanners, in which each target portion is irradiated by scanning the pattern through the beam in a given direction (the "scanning" direction), while synchronously scanning the substrate parallel or anti-parallel to this direction.

An apparatus using an array of individually controllable elements may project radiation onto a substrate using an arrangement known as "pixel grid imaging." In such an arrangement, a micro lens array is used to focus the radiation from each of the individually controllable elements within the array of individually controllable elements onto a spot on the substrate. As radiation is projected onto the substrate, the substrate is scanned at a constant velocity. Therefore, while radiation is directed onto a lens in the micro lens array, a strip of radiation is projected onto the substrate.

The length and position of the strip in the direction of scanning of the substrate is controlled by the array of individually controllable elements, which determines when radiation is directed to the lens and when it is not. The system is configured such that different spots associated with different lenses in the micro lens array can project strips of radiation onto the substrate that are adjacent to each other. Accordingly, a patterned feature can be built up by a plurality of such adjacent strips of the appropriate length and in the appropriate positions.

However, the illumination source is imaged at the substrate. Consequently, the spot projected on the substrate by each lens of the micro-lens array is dependent on the illumination source shape. In turn, this means that the quality of the image generated is dependent on the illumination source shape. Furthermore, the effective source shape may vary over the image field. The effective illumination source shape may vary, for example, due to aberrations in the optics or due to speckle. However, it is desirable for the illumination across the array of individually controllable elements to be uniform and without variations such as speckle.

Therefore, what is needed is a system and method that reduces the variations in image quality caused by variations in an illumination source shape.

SUMMARY OF THE INVENTION

According to an embodiment of the present invention, there is provided a lithographic apparatus comprising an illumination system, a refraction grating, an array of individually controllable elements, a substrate table, and a projection system. The illumination system supplies a beam of radiation. The refraction grating divides the beam into a plurality of sub-beams of radiation. The array of individually controllable elements imparts the beam with a pattern in its cross-section. A plurality of said sub-beams of radiation are directed onto associated individually controllable elements in the array of individually controllable elements. The substrate table supports a substrate. The projection system projects the patterned beam onto a target portion of the substrate.

According to another embodiment of the present invention, there is provided a device manufacturing method comprising the following steps. Providing a substrate. Providing a beam of radiation using an illumination system. Using a refraction grating to divide the beam into a plurality of sub-beams of radiation. Directing a plurality of said sub-beams of radiation onto associated individually controllable elements in an array of individually controllable elements. Using said array of individually controllable elements to impart the beam with a pattern in its cross-section. Projecting the patterned beam of radiation onto a target portion of the substrate.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

The present invention will now be described with reference to the accompanying drawings. In the drawings, like reference numbers may indicate identical or functionally similar elements.

DETAILED DESCRIPTION OF THE EMBODIMENT

Overview and Terminology

Although specific reference may be made in this text to the use of lithographic apparatus in the manufacture of integrated circuits (ICs), it should be understood that the lithographic apparatus described herein may have other applications, such as the manufacture of integrated optical systems, guidance and detection patterns for magnetic domain memories, flat panel displays, thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (e.g., a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The term "array of individually controllable elements" as here employed should be broadly interpreted as referring to any device that can be used to endow an incoming radiation beam with a patterned cross-section, so that a desired pattern can be created in a target portion of the substrate. The terms "light valve" and "Spatial Light Modulator" (SLM) can also be used in this context. Examples of such patterning devices are discussed below.

A programmable mirror array may comprise a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter may filter out the diffracted light, leaving the undiffracted light to reach the substrate. An array of diffractive optical micro electrical mechanical system (MEMS) devices can also be used in a corresponding manner. Each diffractive optical MEMS device can include a plurality of reflective ribbons that can be deformed relative to one another to form a grating that reflects incident light as diffracted light.

A further alternative embodiment can include a programmable mirror array employing a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means.

In both of the situations described here above, the array of individually controllable elements can comprise one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, which are incorporated herein by reference in their entireties.

A programmable LCD array can also be used. An example of such a construction is given in U.S. Pat. No. 5,229,872, which is incorporated herein by reference in its entirety.

It should be appreciated that where pre-biasing of features, optical proximity correction features, phase variation techniques and multiple exposure techniques are used, for example, the pattern "displayed" on the array of individually controllable elements may differ substantially from the pattern eventually transferred to a layer of or on the substrate. Similarly, the pattern eventually generated on the substrate may not correspond to the pattern formed at any one instant on the array of individually controllable elements. This may be the case in an arrangement in which the eventual pattern formed on each part of the substrate is built up over a given period of time or a given number of exposures during which the pattern on the array of individually controllable elements and/or the relative position of the substrate changes.

Although specific reference may be made in this text to the use of lithographic apparatus in the manufacture of ICs, it should be understood that the lithographic apparatus described herein may have other applications, such as, for example, the manufacture of DNA chips, MEMS, MOEMS, integrated optical systems, guidance and detection patterns for magnetic domain memories, flat panel displays, thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g., having a wavelength of 365, 248, 193, 157 or 126 nm) and extreme ultra-violet (EUV) radiation (e.g., having a wavelength in the range of 5–20 nm), as well as particle beams, such as ion beams or electron beams.

The term "projection system" used herein should be broadly interpreted as encompassing various types of projection systems, including refractive optical systems, reflective optical systems, and catadioptric optical systems, as appropriate, for example, for the exposure radiation being used, or for other factors such as the use of an immersion fluid or the use of a vacuum. Any use of the term "lens" herein may be considered as synonymous with the more general term "projection system."

The illumination system may also encompass various types of optical components, including refractive, reflective, and catadioptric optical components for directing, shaping, or controlling the beam of radiation, and such components may also be referred to below, collectively or singularly, as a "lens."

The lithographic apparatus may be of a type having two (e.g., dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index (e.g., water), so as to fill a space between the final element of the projection system and the substrate. Immersion liquids may also be applied to other spaces in the lithographic apparatus, for example, between the mask and the first element of the projection system immersion techniques are well known in the art for increasing the numerical aperture of projection systems.

Further, the apparatus may be provided with a fluid processing cell to allow interactions between a fluid and irradiated parts of the substrate (e.g., to selectively attach chemicals to the substrate or to selectively modify the surface structure of the substrate).

Lithographic Projection Apparatus

Figure 1:
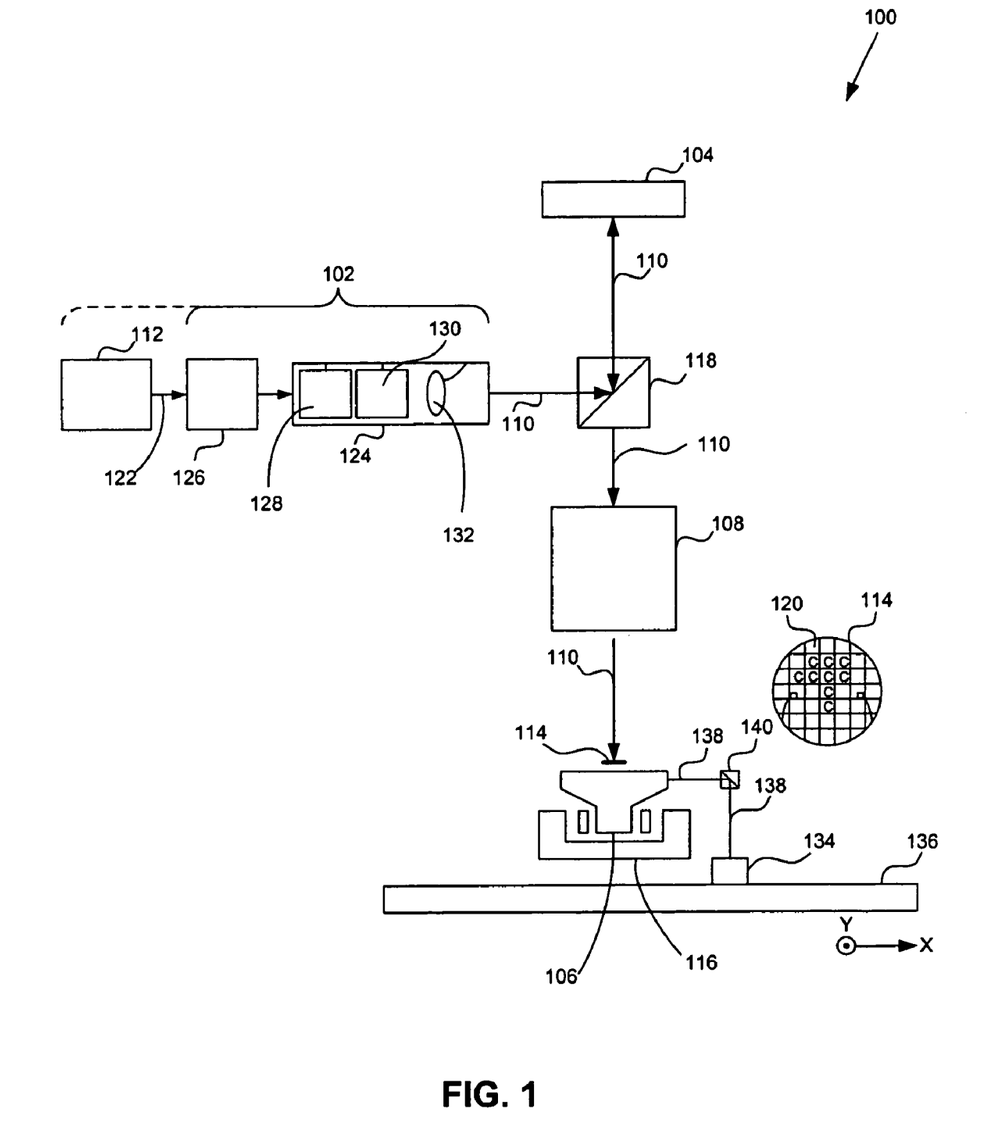
FIG. 1 depicts a lithographic apparatus, according to one embodiment of the invention.

FIG. 1 schematically depicts a lithographic projection apparatus 100 according to an embodiment of the invention. Apparatus 100 includes at least a radiation system 102, an array of individually controllable elements 104, an object table 106 (e.g., a substrate table), and a projection system ("lens") 108.

Radiation system 102 can be used for supplying a beam 110 of radiation (e.g., UV radiation), which in this particular case also comprises a radiation source 112.

An array of individually controllable elements 104 (e.g., a programmable mirror array) can be used for applying a pattern to beam 110. In general, the position of the array of individually controllable elements 104 can be fixed relative to projection system 108. However, in an alternative arrangement, an array of individually controllable elements 104 maybe connected to a positioning device (not shown) for accurately positioning it with respect to projection system 108. As here depicted, individually controllable elements 104 are of a reflective type (e.g., have a reflective array of individually controllable elements).

Object table 106 can be provided with a substrate holder (not specifically shown) for holding a substrate 114 (e.g., a resist coated silicon wafer or glass substrate) and object table 106 can be connected to a positioning device 116 for accurately positioning substrate 114 with respect to projection system 108.

Projection system 108 (e.g., a quartz and/or CaF2 lens system or a catadioptric system comprising lens elements made from such materials, or a mirror system) can be used for projecting the patterned beam received from a beam splitter 118 onto a target portion 120 (e.g., one or more dies) of substrate 114. Projection system 108 may project an image of the array of individually controllable elements 104 onto substrate 114. Alternatively, projection system 108 may project images of secondary sources for which the elements of the array of individually controllable elements 104 act as shutters. Projection system 108 may also comprise a micro lens array (MLA) to form the secondary sources and to project microspots onto substrate 114.

Source 112 (e.g., an excimer laser) can produce a beam of radiation 122. Beam 122 is fed into an illumination system (illuminator) 124, either directly or after having traversed conditioning device 126, such as a beam expander 126, for example. Illuminator 124 may comprise an adjusting device 128 for setting the outer and/or inner radial extent (commonly referred to as σ-outer and σ-inner, respectively) of the intensity distribution in beam 122. In addition, illuminator 124 will generally include various other components, such as an integrator 130 and a condenser 132. In this way, beam 110 impinging on the array of individually controllable elements 104 has a desired uniformity and intensity distribution in its cross section.

It should be noted, with regard to FIG. 1, that source 112 may be within the housing of lithographic projection apparatus 100 (as is often the case when source 112 is a mercury lamp, for example). In alternative embodiments, source 112 may also be remote from lithographic projection apparatus 100. In this case, radiation beam 122 would be directed into apparatus 100 (e.g., with the aid of suitable directing mirrors). This latter scenario is often the case when source 112 is an excimer laser. It is to be appreciated that both of these scenarios are contemplated within the scope of the present invention.

Beam 110 subsequently intercepts the array of individually controllable elements 104 after being directing using beam splitter 118. Having been reflected by the array of individually controllable elements 104, beam 110 passes through projection system 108, which focuses beam 110 onto a target portion 120 of the substrate 114.

With the aid of positioning device 116 (and optionally interferometric measuring device 134 on a base plate 136 that receives interferometric beams 138 via beam splitter 140), substrate table 106 can be moved accurately, so as to position different target portions 120 in the path of beam 110. Where used, the positioning device for the array of individually controllable elements 104 can be used to accurately correct the position of the array of individually controllable elements 104 with respect to the path of beam 110, e.g., during a scan. In general, movement of object table 106 is realized with the aid of a long-stroke module (course positioning) and a short-stroke module (fine positioning), which are not explicitly depicted in FIG. 1. A similar system may also be used to position the array of individually controllable elements 104. It will be appreciated that beam 110 may alternatively/additionally be moveable, while object table 106 and/or the array of individually controllable elements 104 may have a fixed position to provide the required relative movement.

In an alternative configuration of the embodiment, substrate table 106 may be fixed, with substrate 114 being moveable over substrate table 106. Where this is done, substrate table 106 is provided with a multitude of openings on a flat uppermost surface, gas being fed through the openings to provide a gas cushion which is capable of supporting substrate 114. This is conventionally referred to as an air bearing arrangement. Substrate 114 is moved over substrate table 106 using one or more actuators (not shown), which are capable of accurately positioning substrate 114 with respect to the path of beam 110. Alternatively, substrate 114 may be moved over substrate table 106 by selectively starting and stopping the passage of gas through the openings.

Although lithography apparatus 100 according to the invention is herein described as being for exposing a resist on a substrate, it will be appreciated that the invention is not limited to this use and apparatus 100 may be used to project a patterned beam 110 for use in resistless lithography.

The depicted apparatus 100 can be used in four preferred modes:

1. Step mode: the entire pattern on the array of individually controllable elements 104 is projected in one go (i.e., a single "flash") onto a target portion 120. Substrate table 106 is then moved in the x and/or y directions to a different position for a different target portion 120 to be irradiated by patterned beam 110.

2. Scan mode: essentially the same as step mode, except that a given target portion 120 is not exposed in a single "flash." Instead, the array of individually controllable elements 104 is movable in a given direction (the so-called "scan direction", e.g., the y direction) with a speed v, so that patterned beam 110 is caused to scan over the array of individually controllable elements 104. Concurrently, substrate table 106 is simultaneously moved in the same or opposite direction at a speed V=Mv, in which M is the magnification of projection system 108. In this manner, a relatively large target portion 120 can be exposed, without having to compromise on resolution.

3. Pulse mode: the array of individually controllable elements 104 is kept essentially stationary and the entire pattern is projected onto a target portion 120 of substrate 114 using pulsed radiation system 102. Substrate table 106 is moved with an essentially constant speed such that patterned beam 110 is caused to scan a line across substrate 106. The pattern on the array of individually controllable elements 104 is updated as required between pulses of radiation system 102 and the pulses are timed such that successive target portions 120 are exposed at the required locations on substrate 114. Consequently, patterned beam 110 can scan across substrate 114 to expose the complete pattern for a strip of substrate 114. The process is repeated until complete substrate 114 has been exposed line by line.

4. Continuous scan mode: essentially the same as pulse mode except that a substantially constant radiation system 102 is used and the pattern on the array of individually controllable elements 104 is updated as patterned beam 110 scans across substrate 114 and exposes it.

Combinations and/or variations on the above described modes of use or entirely different modes of use may also be employed.

Exemplary Illumination and Projection for Patterning and Exposure

Figure 2:
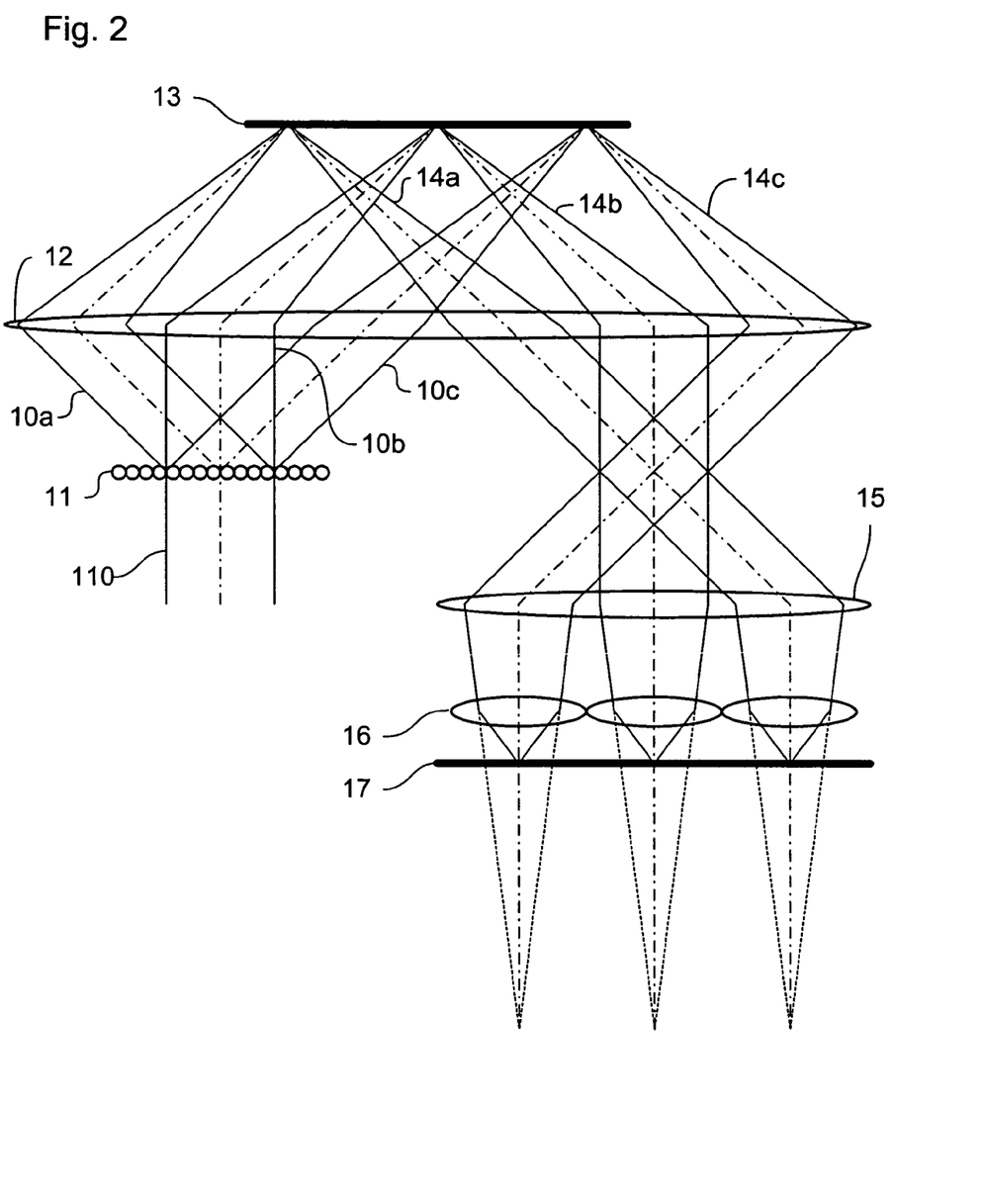
FIG. 2 depicts in detail an arrangement for illuminating a substrate, according to one embodiment of the invention.

FIG. 2 depicts a portion of lithography system 100, according to one embodiment of the present invention. Beam 110 provided by the illumination system 102 is directed onto a refraction grating 11 that divides beam 110 into a plurality of sub-beams 10a,10b,10c. A lens or lens group 12 is used to project sub-beams 10a,10b,10c onto an array of individually controllable elements 13. Each sub-beam 10a,10b,10c is focused onto one or more of the individually controllable elements in array of individually controllable elements 13. At each instant the individually controllable elements are set to a desired pattern, and accordingly modulate sub-beams 10a,10b,10c.

For example, array of individually controllable elements 13 may modulate an intensity of sub-beams 10a,10b,10c. The modulated sub-beams 14a,14b,14c are directed by lens or lens group 12 onto a second lens or lens group 15, which in turn directs modulated sub-beams 14a,14b,14c onto an array of forming elements 16, for example a micro lens array. Array of focusing elements 16 focuses modulated sub-beams 14a,14b,14c onto substrate 17. Accordingly, refraction grating 11 splits radiation 110 from source 102 and effectively provides a plurality of radiation sources with improved uniformity of shape and intensity. Furthermore, the efficiency of the illumination system 102 is improved because no radiation is wasted in the process of dividing radiation beam 110 into sub-beams 10a,10b,10c.

It is to be appreciated that although the arrangement shown in FIG. 2 utilizes a single lens or lens group 12 to focus sub-beams of radiation 10a,10b,10c onto array of individually controllable elements 13 and to direct radiation 14a, 14b, 14c from array of individually controllable elements 13 onto second lens or lens group 15, this specific arrangement need not be used with the present invention. In other examples, separate lenses or lens groups may be used for providing radiation 10a, 10b, 10c to array of individually controllable elements 13 and receiving radiation 14a, 14b, 14c from array of individually controllable elements 13. In such an arrangement, second lens or lens group 15 may be redundant.

In another example, individual focusing elements may be used in place of first lens or lens group 12 to focus each of sub-beams of radiation 10a, 10b, 10c onto array of individually controllable elements 13.

Likewise, in another example, individual lenses or lens groups may be used to direct the individual modulated sub-beams of radiation 14a,14b,14c and project them onto substrate 17.

It will further be appreciated that a compromise arrangement may be used in which a lens or lens group is used for a proportion of sub-beams 10a, 10b, 10c or modulated sub-beams 14a,14b,14c.

It is to be appreciated that although FIG. 2 shows beam 110 being split into three sub-beams 10a,10b,10c, any number of sub-beams can be produced using refraction grating 11. It is also to be appreciated that, as discussed below, refraction grating 13 may be arranged to separate beam 110 into sub-beams 10a,10b,10c directed in more than just one direction. For example, refraction grating 13 may be arranged to generate an array of sub-beams. Specifically, the refraction grating may, for example, be arranged to generate an array of 256 by 256 sub-beams.

Exemplary Refraction Grating

Figure 3:
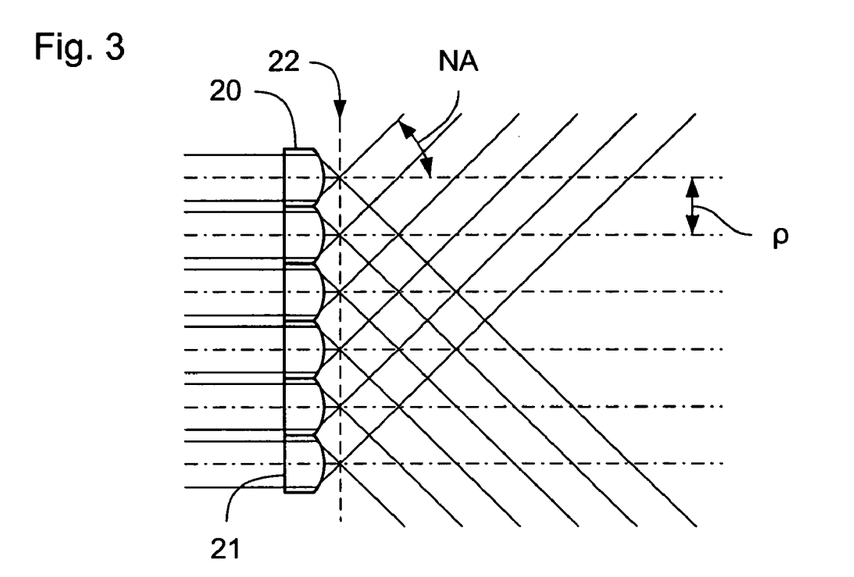
FIG. 3 explains the principle by which a refraction grating operates.

FIG. 3 shows characteristics of a refraction grating, according to one embodiment of the present invention. In this embodiment, a refraction grating 20 comprises a plurality of cylindrical lenses 21 (e.g., lenses having one or more surfaces that form part of a cylinder). Cylindrical lenses 21 are arranged adjacent to one another in a row, such that their elongate axes (e.g., an axis perpendicular to a cross section of the lens that remains constant along a length of the elongate lens) are mutually parallel. As shown in the cross-section of FIG. 3, each of the cylindrical lenses focuses the radiation to a line, parallel to the elongate axis of the cylindrical lens (e.g., only a point in cross-section as shown in FIG. 3). The focal lines are arranged in a row 22, which is parallel to the row of cylindrical lenses 21. For example, the row of focal lines 22 can function in a corresponding fashion to a row of slits in a diffraction grating. Refraction grating 20 provides a similar effect to a diffraction grating formed from a plurality of parallel slits, namely providing a series of lines of maximum intensity or, in effect, splits the beam into sub-beams. However, refraction grating 20 is significantly more efficient because substantially all of the radiation incident on refraction grating 20 is directed into the sub-beams, whereas with a diffraction grating the majority of the radiation is absorbed (e.g., that which is incident on the diffraction grating between the slits).

As shown in FIG. 3, in one example cylindrical lenses 21 have a surface on one side that is part of a cylinder and are planar on the reverse side. In another example, each cylindrical lens 21 is a complete cylinder.

In general, the proportion of the cylindrical lens that is curved will determine the divergence of the beam of radiation generated by each lens, i.e., a numerical aperture NA of the lens. This in turn determines the spread of the sub-beams generated by refraction grating 20. Accordingly, selection of the shape of the lenses can be used to select the distribution of the sub-beams.

In one example, a curved portion of cylindrical lenses 21 used in refraction grating 20 are a portion of an ellipse in cross-section. In another example, the cross-section of the lenses may be a complete ellipse.

Subsequent references to cylindrical lenses 21 in this description relate to lenses used in the refraction gratings 20 of the present invention, and may therefore include lenses having a cross-section including a portion of an ellipse, or that is otherwise modified as described below.

Figure 4:
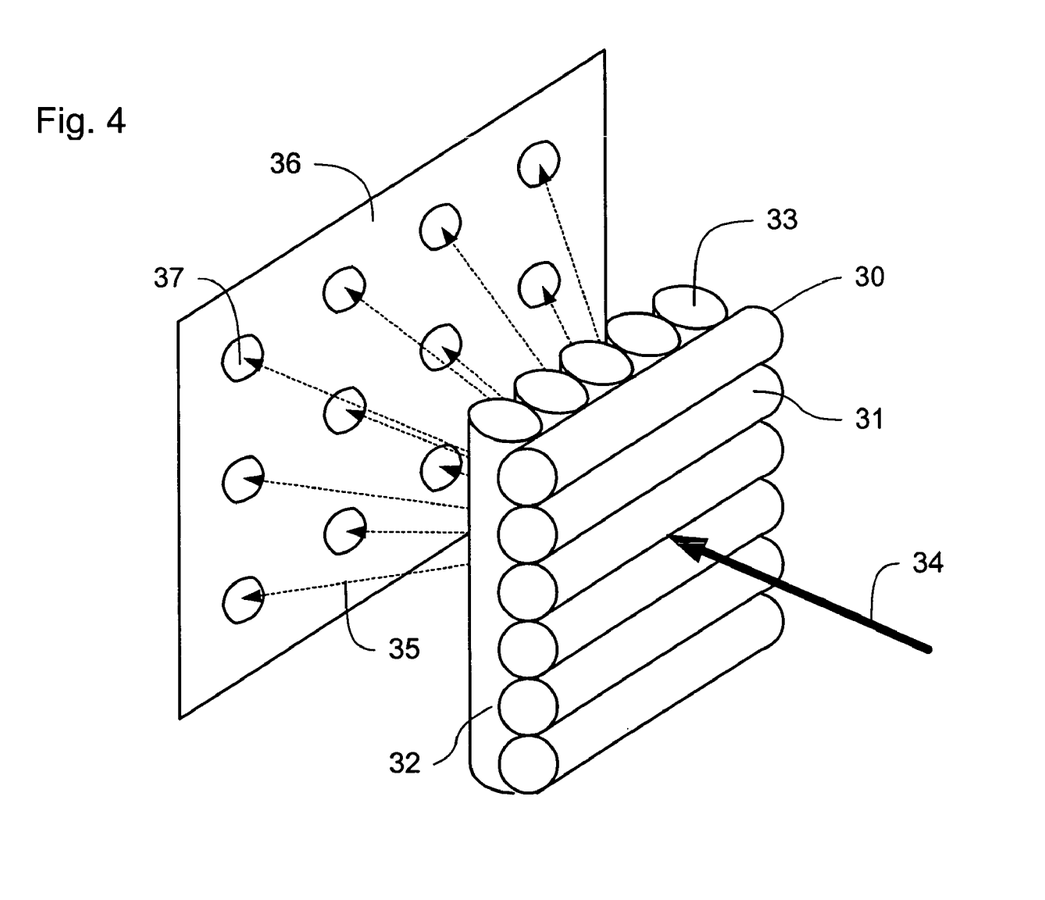
FIG. 4 depicts a refraction grating, according to one embodiment of the invention.

FIG. 4 depicts a refraction grating 31, according to one embodiment of the invention. A first array 30 of cylindrical lenses is arranged with elongate axes of the lenses arranged parallel to one another in a first direction. Incident radiation 34 passes through first array 30 and is divided into bands of radiation, as discussed above. These bands are incident on a second array 32 of cylindrical lenses, which is arranged with elongate axes of its constituent cylindrical lenses perpendicular to those of first array 30 of cylindrical lenses. Second array 32 of cylindrical lenses divides the radiation in a direction that is perpendicular to the direction in which the radiation was divided by first array 30. Consequently, the combined refraction grating 31 divides beam of radiation 34 into an array of sub-beams 35. In one example, sub-beams 35, if projected onto a plane 36, generate an array of spots 37. As described above, in practice refraction grating 31 maybe arranged to generate an array of 256 by 256 sub-beams of radiation 35 in order to provide an array of 256 by 256 spots that can be projected onto a substrate (not shown).

Although FIG. 4 shows two separate arrays of cylindrical lenses 30 and 32 used in conjunction to combine refraction grating 31, it will be appreciated that a single combined element may be used. For example, the lenses for each array may be formed on opposite sides of a single glass plate. Alternatively, the requisite features may be formed on the same side of a glass plate. In this case, the curved profile of the required cylindrical lenses may be ground on a first side of the glass plate with the lens features arranged parallel to a first direction. Subsequently, the profile for the second set of lenses are ground on the same side of the glass plate, but in a direction perpendicular to the first direction. In either case, the radiation effectively passes consecutively through first and second arrays of lenses.

In one example, a number of sub-beams 35 generated by refraction grating 31 may be controlled by selecting a numerical aperture NA of the cylindrical lenses of the cylindrical lens arrays 30, 32 (e.g., by selecting the necessary lens shape), a pitch p of the cylindrical lens arrays 30, 32 (e.g., a distance between the focal lines of the cylindrical lenses), and a size of the cylindrical lens array 30,32. As discussed above, the distribution of sub-beams 35 may be controlled by selection of the shape of the lenses 30, 32. The size of the cylindrical lens array also determines the distribution of intensity of radiation across sub-beams 35. As with a diffraction grating, the intensity of the radiation across sub-beams 35 may vary depending on the overall size of refraction grating 31. For example, with a sufficiently large refraction grating 31, it is possible to have substantially the same intensity of radiation for all of sub-beams 35. In a further example, the intensity distribution of sub-beams 35 maybe adjusted by adjusting the intensity distribution of radiation 34 illuminating refraction grating 31. In a still further example, the system may be configured such that the intensity of the radiation in sub-beams 35 towards the one or more of the edges of the array of sub-beams is reduced.

In one example, reducing the intensity of some sub-beams 35 may be advantageous, for example, because a lithographic apparatus may have a plurality of so-called "light engines" that project patterned beams or arrays of modulated spots onto the substrate at the same time. For example, each light engine may have an independent combination of an illumination system, an array of individually controllable elements, and a projection system. In this example, the patterns projected onto the substrate by each of the light engines needs to be accurately aligned to avoid discontinuities in the pattern produced. The accuracy of the alignment that is required may be reduced by overlapping the patterns produced by two light engines, commonly referred to as "stitching." However, in this example the intensity of the pattern produced by each light engine in the overlap region needs to be reduced. This may be effected by the provision of radiation attenuators. However, using the present invention, this may alternatively be effected by configuring refraction grating 31 such that the intensity of the sub-beams 35 of radiation that are used to generate spots of radiation on the substrate in the overlap regions is inherently reduced. The allows for no radiation to be absorbed in attenuators, improving the efficiency of utilization for the radiation generated by the radiation source. This can avoid problems caused by thermal effects, which are in turn caused by the heating of the attenuators that absorb radiation.

In one example, the intensity distribution across the array of sub-beams of radiation 35 may also be adjusted by providing small variations in the cross-section of the cylindrical lenses within the arrays of cylindrical lenses 30, 33.

In another example, small variations in the cross-section of the cylindrical lenses may be used to compensate for tolerances in the manufacture of the lenses. For example, a uniform radiation distribution across the sub-beams 35 may be provided by provision of a refraction grating 31 in which all of the lenses are a particular shape. If, however, all of the lenses are the same, but not quite the optimal shape, then there will some variation in intensity across the sub-beams of radiation. Therefore, it may be desirable to deliberately ensure that the lenses vary from each other slightly, such that the effect of the variations from the optimal lens shape averages out, resulting in an improved uniformity of intensity distribution across the sub-beams of radiation 35.

In a lithographic projection apparatus a single radiation source may not provide sufficient power to efficiently expose a substrate. Therefore, it is often desirable to combine the output of two or more radiation sources.

Figure 5:
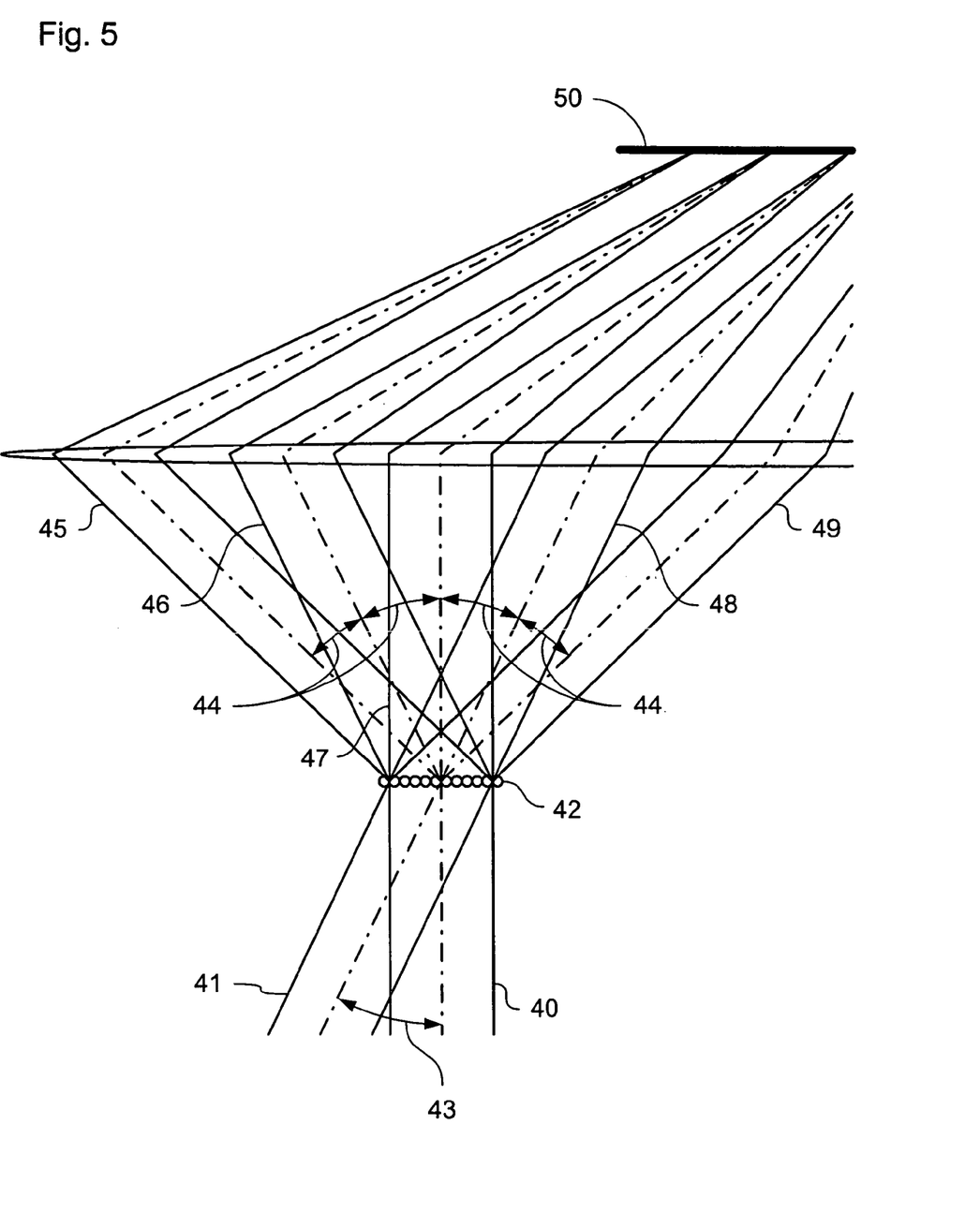
FIG. 5 depicts a further arrangement, according to one embodiment of the invention.

FIG. 5 depicts a further arrangement, according to one embodiment of the invention. If a beam of radiation is directed onto a refraction grating at an oblique angle, the refraction grating still generates a plurality of sub-beams of radiation at a range of angles relative to the incident beam of radiation. The angular separation between the sub-beams of radiation produced remains the same. Accordingly, provided the angles between beams that are incident on the refraction grating are equal to an integer multiple of the angular separation between the sub-beams, the sub-beams produced from each beam will coincide.

In FIG. 5, two beams 40,41 are directed onto a refraction grating 42. An angular separation 43 between beams 40, 41 is equal to an angular separation 44 between each of the sub-beams 45,46,47,48,49. Accordingly, each of sub-beams 45,46,47,48,49 is comprised of a constituent from first beam 40 and a constituent from second beam 41. Therefore, even if there is a variation in the intensity between the first and second beams 40,41, there is no variation between the intensity of sub-beams 45,46,47,48,49 and each of individually controllable elements 50 receives a substantially equal illumination intensity.

It will be appreciated that, in one example, a significant number of beams may be combined and, where a refraction grating as shown in FIG. 4 is used (e.g., one that generates an array of sub-beams), the beams may be combined in more than one plane.

Depending on the number of sub-beams generated by each beam and the angular separation between the beams (e.g., a number of integer multiples of the angular separation between the sub-beams), one or more of the sub-beams at the edge of the array may not include radiation from one of the beams.

For example, if in the arrangement shown in FIG. 5 each beam generates five sub-beams, then each of the sub-beams 45,46,47,48,49 would include a constituent from the first beam 40. However, because of its angle, second beam 41 would only provide radiation to sub-beams 46,47,48,49 and a sub-beam beyond sub-beam 49 that is not shown in FIG. 5. In other words, sub-beam 45 would not include a constituent from the beam 41. As discussed above, it is often desirable to have reduced intensity of the sub-beams that provide spots of radiation on the substrate that are within an overlap region with an adjacent light engine. The reduction in the intensity for such peripheral sub-beams may be provided by arranging the combination of beams such that the peripheral sub-beams include components from fewer beams of radiation than the sub-beams in the central portion of the array.

In order to provide accurate overlay of the constituent parts of each of the sub-beams of radiation, in one example the angular separation between the beams of radiation should be accurate. The beams of radiation provided by each radiation source may initially be parallel.

Figure 6:
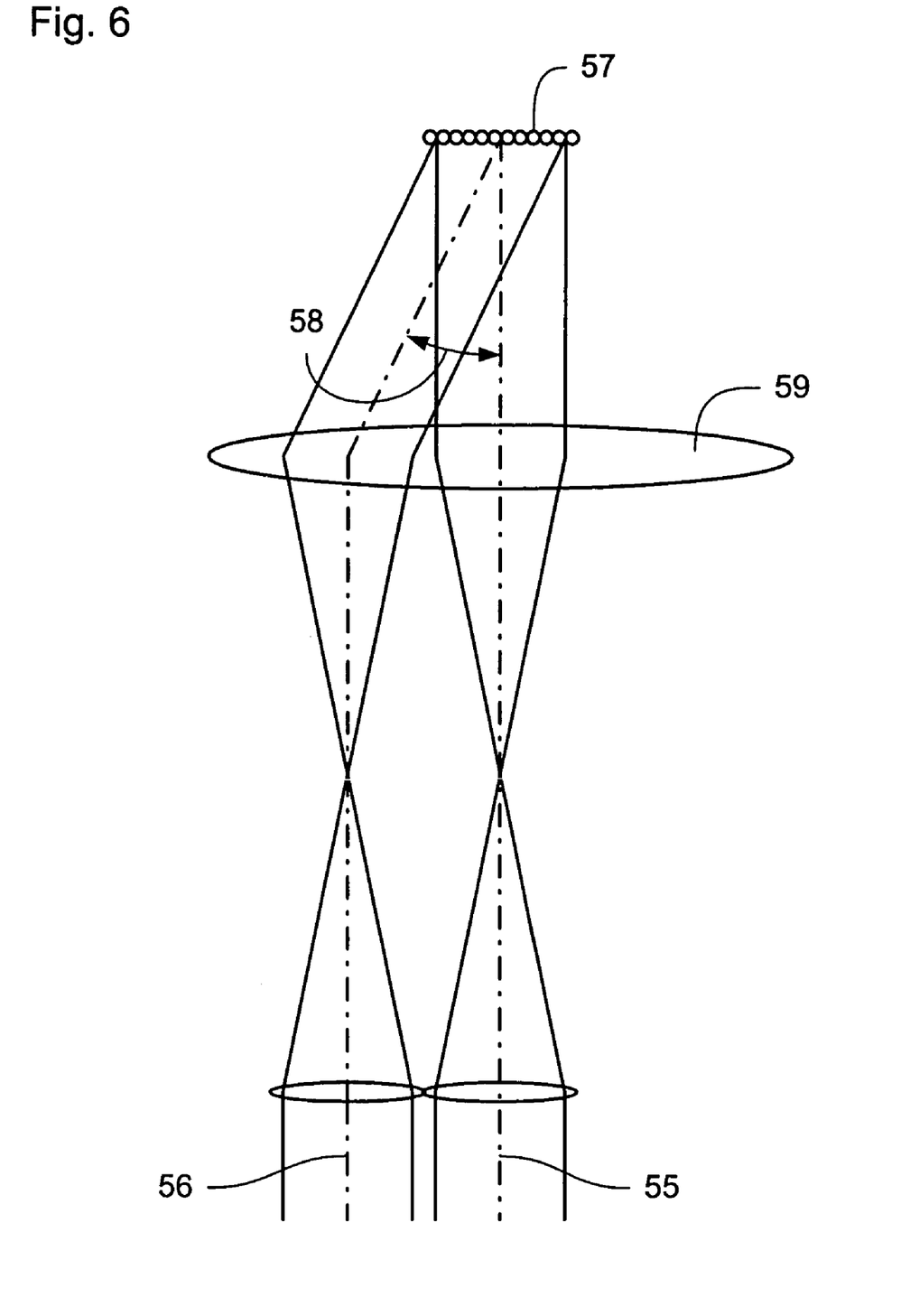
FIG. 6 depicts another arrangement, according to one embodiment of the invention.

FIG. 6 depicts another arrangement, according to one embodiment of the invention. This arrangement shows a configuration for projecting two parallel beams of radiation 55,56 onto a refraction grating 57 at a required angular separation 58. In this embodiment, this is accomplished by directing beams of radiation 55,56 into an appropriately selected single lens or lens group 59 arranged such that the refraction grating 57 is arranged at the focal point of lens or lens group 59.

It will be appreciated that other arrangements may be used to provide the beams at the appropriate angles, for example by using plane reflectors. However, using an arrangement with a single lens such as shown in FIG. 6 may be desirable so that a plurality of parallel beams of radiation can be accurately combined simultaneously.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A lithographic apparatus, comprising:
   an illumination system that supplies a beam of radiation;
   an array of cylindrical lenses arranged so that their elongated axes are parallel and so that each cylindrical lens of the array of cylindrical lenses receives a respective portion of the beam perpendicular to its elongated axis, the array of cylindrical lenses dividing the beam of radiation into a plurality of sub-beams of radiation;
   an array of individually controllable elements being configured such that the plurality of sub-beams of radiation are directed onto corresponding individually controllable elements in said array of individually controllable elements to pattern the plurality of sub-beams of radiation; and
   a projection system that projects the patterned plurality of sub-beams of radiation onto a target portion of a substrate.

2. The lithographic apparatus of claim 1, further comprising:
   a second array of cylindrical lenses, wherein the beam of radiation passes consecutively through the first and the second arrays of cylindrical lenses.

3. The lithographic apparatus of claim 2, wherein the cross-sections of the cylindrical lenses in at least one of the first and second arrays of cylindrical lenses are substantially the same.

4. The lithographic apparatus of claim 2, wherein a distribution of intensities of the sub-beams of radiation is provided by at least one of:
   a shape of the lenses in at least one of the first or the second array of cylindrical lenses;
   a width of at least one of the first or the second array of cylindrical lenses;
   a separation between the cylindrical lenses in at least one of the first and the second arrays of cylindrical lenses;
   cross-sections of the lenses varying across at least one of the first or the second array of cylindrical lenses;
   a radiation intensity profile of the beam of radiation incident on the first array of cylindrical lenses; and
   one or more attenuators located between the first and the second array of cylindrical lenses and the array of individually controllable elements.

5. The lithographic apparatus of claim 1, wherein each of the plurality of sub-beams of radiation is focused onto one or more of the individually controllable elements.

6. The lithographic apparatus of claim 1, wherein a single lens or lens group is used to focus all of the plurality of sub-beams of radiation onto the array of individually controllable elements.

7. The lithographic apparatus of claim 6, further comprising:
   an array of focusing elements that focus the patterned plurality of sub-beams of radiation from the array of individually controllable elements onto a plurality of spots on the substrate.

8. The lithographic apparatus of claim 7, wherein said single lens or lens group further directs the patterned plurality of sub-beams of radiation from the arrays of individually controllable elements onto the array of the focusing elements.

9. The lithographic apparatus of claim 1, wherein:
   the illumination system provides at least a further beam of radiation, and
   the beam of radiation and the at least a further beam of radiation are directed onto the first array of cylindrical lenses and each of the beam of radiation and the at least a further beam of radiation is divided into respective plurality of sub-beams of radiation.

10. The lithographic apparatus of claim 9, wherein the beam of radiation and the at least a further beam of radiation are directed onto the first array of cylindrical lenses at an angle relative to each other, such that at least one of the plurality of sub-beams of radiation derived from the beam of radiation and the at least a further beam of radiation coincides.

11. The lithographic apparatus of claim 10, wherein the beam of radiation and the at least a further beam of radiation provided by the illumination system are parallel to each other and are directed onto the first array of cylindrical lenses at relative angles by a lens or lens group.

12. A device manufacturing method, comprising:
(a) providing a beam of radiation perpendicular to respective elongated axes of an array of cylindrical lenses;
(b) dividing the beam of radiation into a plurality of sub-beams using the array of cylindrical lenses;
(c) patterning each one of the plurality of said sub-beams using selected individually controllable elements in an array of individually controllable elements;
(d) projecting the patterned sub-beams of radiation onto a target portion of a substrate.

13. The method of claim 12, wherein before step (c) the method further comprises:
dividing the sub-beams of radiation using another array of cylindrical lenses.

14. The method of claim 12, wherein step (b) comprises diffracting the beam of radiation using the array of cylindrical lenses to form the plurality of sub-beams.

15. The lithographic apparatus of claim 2, wherein the lenses of the second array of cylindrical lenses are arranged such that their elongate axes are perpendicular to those of the first array of cylindrical lenses.

16. The lithographic apparatus of claim 1, further comprising:
a first optical device that directs each of the plurality of sub-beams of radiation onto a target portion of the array of individually controllable elements; and
a second optical device that directs each of the patterned plurality of sub-beams of radiation from a corresponding one of the target portions of the individually controllable elements onto a corresponding section of the target portion of the substrate.

17. The lithographic apparatus of claim 1, wherein the array of cylindrical lenses is configured to diffract the beam of radiation to form the plurality of sub-beams of radiation.

* * * * *